United States Patent [19]

Fukushima et al.

[11] Patent Number: 5,005,179
[45] Date of Patent: Apr. 2, 1991

[54] SEMICONDUCTOR DEVICE

[75] Inventors: Toru Fukushima; Tsunehisa Takabayashi; Mikio Ogai, all of Yokohama, Japan

[73] Assignee: The Furukawa Electric Company, Ltd., Tokyo, Japan

[21] Appl. No.: 364,366

[22] Filed: Jun. 8, 1989

[30] Foreign Application Priority Data

Jun. 8, 1988 [JP] Japan .................................. 63-140832
Feb. 15, 1989 [JP] Japan .................................... 1-35784

[51] Int. Cl.⁵ ............................................. H01S 3/19
[52] U.S. Cl. ...................................... 372/46; 372/45; 357/16; 357/17
[58] Field of Search ..................... 372/43, 44, 45, 46, 372/48; 357/16, 17

[56] References Cited

U.S. PATENT DOCUMENTS 4,121,179 10/1978 Chinowe et al. ..................... 372/45
4,142,160 2/1979 Tsukada et al. ..................... 372/46
4,740,976 4/1988 Kajimura et al. ..................... 372/45

OTHER PUBLICATIONS

Temkin et al., "The Bell System Technical Journal", InGaAsP LEDs for 1.3-$\mu$m Optical Transmission, vol. 62, Jan. 1983, No. 1.

Primary Examiner—Georgia Y. Epps
Attorney, Agent, or Firm—Foley & Lardner, Schwartz, Jeffery, Schwaab, Mack, Blumenthal & Evans

[57] ABSTRACT

A semiconductor device having a current blocking layer and confinement current passing part formed on a semiconductor layer, and an electrode metal layer disposed on said current blocking layer and confinement current passing part, wherein the current blocking layer is made of semiconductor material, and the contact resistance of current blocking layer and electrode metal layer is higher than the contact resistance of electrode metal layer and semiconductor layer, and/or the resistivity of the current blocking layer is higher than that of the semiconductor layer.

13 Claims, 4 Drawing Sheets

SEMICONDUCTOR DEVICE

BACKGROUND OF THE INVENTION

This invention relates to an improved structure of the electrode portion in a semiconductor possessing a current blocking layer.

As current confinement means in a semiconductor device, it is known to form a confinement current passing part in a size suited to the current passage in an insulation film of $SiO_2$, $SiN_x$ or the like, and to evaporate an electrode metal layer thereon.

As its practical example, one as shown in FIG. 7 has been already presented.

In the semiconductor laser device in FIG. 7, an n-type layer 2, InGaAsP active layer 3, p-type layer 4, and InGaAsP contact layer 5 are sequentially grown on the upper surface of an n-type InP substrate 1, and an $SiO_2$ insulation film 6 is evaporated on the InGaAsP contact layer 5, and a part of the $SiO_2$ insulation film 6 is removed in a window form by etching means so as to expose the surface of the InGaAsP contact layer 5, thereby forming a confinement current passing part 9, and then a p-type electrode metal layer 7 is evaporated on the surface of InGaAsP contact layer 5 and on the $SiO_2$ insulation film 6, and an n-type electrode metal layer 8 is evaporated on the lower surface of the n-type InP substrate 1.

In the case of thus fabricated semiconductor laser device, by applying a voltage between the p-type electrode metal layer 7 and the n-type electrode metal layer 8, the current passes only through the confinement current passing part 9 disposed on the $SiO_2$ insulation film 6 and flows to the side of n-type electrode metal layer 8, and this current emits light when passing through the InGaAsP active layer 3.

This light emitting portion is nearly equal to or larger than the confinement current passing part 9.

In such prior art, however, the following technical problems are left unsolved.

That is, the coefficient of thermal expansion of insulation film 6 of $SiO_2$, $SiN_x$ or the like is smaller by one or two digits than the coefficient of thermal expansion of a compound semiconductor, and along with the temperature rise when injecting current, the stress is concentrated on the end portion of the dielectric film 6, and a defect occurs in the contact layer 5.

This defect propagates up to the active layer 3 along the crystal direction of the semiconductor crystal, and deteriorates the light emission efficiency of the semiconductor laser device.

SUMMARY OF THE INVENTION

In the light of such technical problem, it is hence a primary object of this invention to present a highly reliable semiconductor device excelling in quality and characteristics, and also capable of achieving a sufficient current confinement by inhibiting the leakage current in the portion other than the confinement current passing part.

The semiconductor device according to the present invention has, in order to achieve the above object, a current blocking layer and confinement current passing part formed on a semiconductor layer, and electrode metal layer disposed on said current blocking layer and confinement current passing part, wherein the current blocking layer is made of semiconductor material, and the contact resistance of current blocking layer and electrode metal layer is higher than the contact resistance of electrode metal layer and semiconductor layer, and/or the resistivity of current blocking layer is higher than that of the semiconductor layer.

According to a preferred embodiment, the semiconductor device has an insulation film possessing a current confinement window wider in window area than the current confinement window of the current blocking layer, intervening between the current blocking layer and electrode metal layer.

In the semiconductor device, the resistance value $r_b$ of the current blocking layer or semiconductor itself is expressed in equation (1) below, supposing its own resistivity to be $\rho$, area to be S and thickness to be l, and the contact resistance $r_c$ generated between the current
i blocking layer and the semiconductor or electrode metal layer is expressed in equation (2), supposing the resistance value per unit area between the two to be R and contact area to be S.

$$r_b = \rho \cdot l / S \quad (1)$$

$$r_c = R/S \quad (2)$$

Therefore, the total resistance value r between the electrode metal layer and current blocking layer, or the confinement current passing part and its lower semiconductor layer is expressed as $r_b + r_c$.

Meanwhile, the contact resistance between the current blocking layer or confinement current passing part and its lower semiconductor layer appears to be a problem, but it is the mutual contact resistance of semiconductors and therefore can be ignored.

In the case of the semiconductor device according to the specific invention, a confinement current is injected from the electrode metal layer to the semiconductor layer, for example, from the electrode metal layer to the confinement current passing part of the current blocking layer and to the semiconductor layer.

In this case, the current blocking layer (semiconductor material) is made of such a semiconductor material that its contact resistance value $r_1$ with the electrode metal layer (metal conductor) is higher than the contact resistance value $r_2$ of the electrode metal layer and semiconductor layer, and/or that the resistivity $p_1$ of the current blocking layer is higher than the resistivity $p_2$ of the semiconductor layer, and moreover the coefficient of thermal expansion of the current blocking layer is same as the coefficient of thermal expansion of the semiconductor layer, therefore, if a temperature rise should occur in the semiconductor device when injecting the current, internal stress and defect hardly occur, and deterioration of characteristics of the semiconductor device is scarcely noted.

Incidentally, in the semiconductor device of the specific invention, if the contact resistance value $r_1$ (or resistivity $p_1$) is not sufficiently higher than the contact resistance value $r_2$ (or resistivity $p_2$) and the area S1 of the current confinement part is wider than the area S2 of the confinement current passing part, it is difficult to inhibit the leakage current in other portion than the confinement current passing part, and it is hard to achieve a sufficient current confinement.

For example, in the case of a semiconductor device measuring 500 μm by 500 μm, with the inside diameter of the current confinement part of 25 μm, the radio S1/S2 reaches as far as $10^3$ approximately, and to achieve r1/R2 of approximately $10^3$ by raising the purity of the current blocking layer, the technical difficulty is extremely high.

In the semiconductor device by the related invention, since the majority of the current blocking layer is covered by the insulation film of $SiO_2$, $SiN_x$ or the like in the semiconductor device of the specific invention, Si can be substantially decreased.

In other words, in the case of the related invention, an insulation film possessing a current confinement window (the first confinement window of S1+S2) wider in the window area than the current confinement window (the second current confinement window with an area of S2) of the current blocking layer is intervening between the current blocking layer and the electrode metal layer, and moreover the confinement current passing part determined by the second current confinement window settles within the confinement current passing part determined by the first current confinement window.

Explaining this in the aforementioned relation, the area of the substantial current blocking part S1 and the area of the confinement current passing part is S2, and for example it is possible to set the relation of $S1/S2 < 10$, or when set as $r_1/r_2 = 10$, the leakage current can be reduced.

A known example of $r_1/r_2 = 10$ is described in details in The Bell System Technical Journal, Volume 62, Number 1, pages 1 to 25 (January 1983), "InGaAsP LEDs for 1.3-$\mu$m Optical Transmission."

In this publication, it is mentioned, for example, that $R_{InP}/R_{InGaAs}$ can be set at 7 to 8 as the current blocking layer.

Furthermore, in the semiconductor device of the related invention, if a stress is caused inside the first current confinement window of the insulation film due to current injection, the stress concentrated portion at this time is sufficiently outside of the confinement current passing part by the second current confinement window, any defect is not formed in the confinement current passing part, and nonlight emitting phenomenon derived from the defect may be avoided, and the reliability of the semiconductor device may be further enhanced.

Some of the embodiments of semiconductor device according to this invention will now be described in details with reference to the accompanying drawings.

Figure 1:
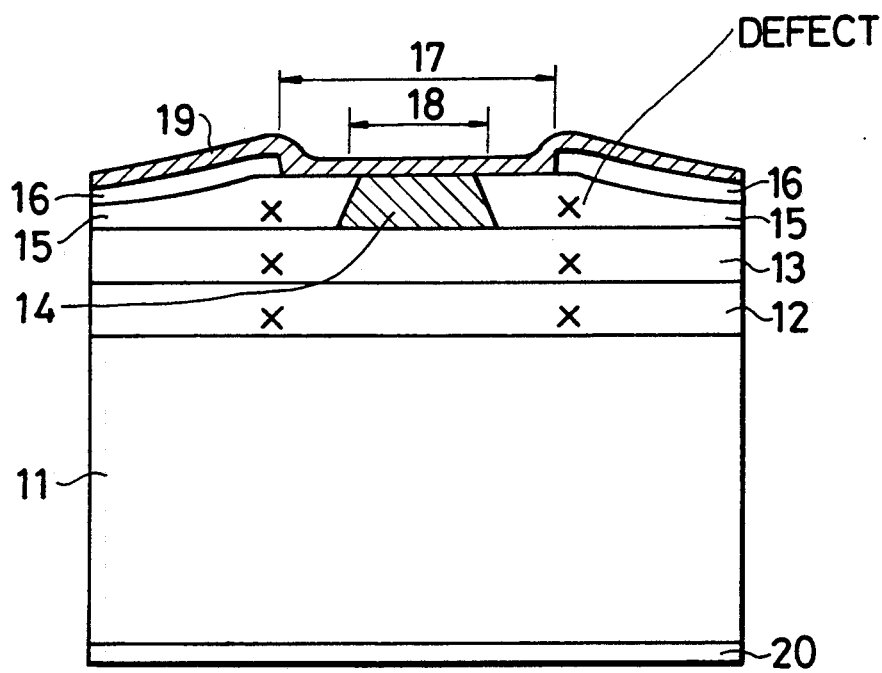
FIG. 1 is a sectional view of a first embodiment of the semiconductor device of the invention.

First, the semiconductor device shown in FIG. 1 is explained.

In FIG. 1, numeral 11 denotes an n-type InP substrate having an InP buffer layer, 13 is an InGaAsP active layer formed on this n-type InP substrate 11, and 13 is an InP (or ZnInP)-clad layer formed on this InGaAsP active layer 12.

On the InP clad layer 13, in its middle part, a mesa-shaped InGaAsP contact layer 14 is formed, and around this mesa-shaped InGaAsP contact layer 14, an n-type InP (or Fe-doped InP, nondoped InP) buried layer 15 is formed, and on this n-type InP buried layer 15, an insulation film 16 made of silicon dielectric such as $SiN_2$, $SiO_2$ and amorphous Si is formed.

In this constitution, the opening in the middle of the silicon insulation film 16 is enclosed by the first current confinement window 17 and the buried layer 15, where a second current confinement window 18 is formed, and in the relative relation of the first current confinement window 17 and second current confinement window 18, the window area of the first current confinement window 17 is wider than the window area of the second current confinement window 18.

Moreover, in order to cover the upper surfaces of the silicon insulation film 16, n-type InP buried layer 15, and InGaAsP contact layer 14, p-type electrode metal layers 19 of Ti, Pt, Au or their alloy are provided on these surfaces, while an n-type electrode metal layer 20 made of the above metal conductor is disposed on the lower surface of the n-type InP substrate 11.

Figure 2A:
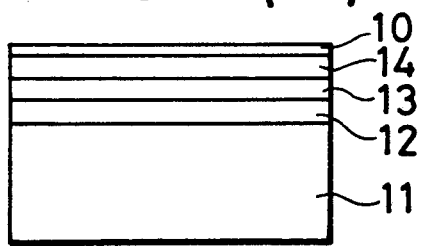
FIG. 2 (A), (B), (C) are principal process drawings for fabricating the semiconductor device in FIG. 1.
Figure 2B:
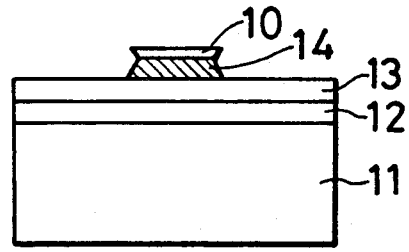
Figure 2C:
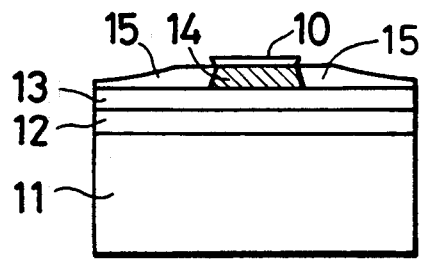

Referring then to FIG. 2 (A), (B), (C), an example of fabrication of the semiconductor device shown in FIG. 1 is explained below.

First, as shown in FIG. 2 (A), on the n-type InP substrate, an InP buffer layer (not shown), InGaAsp active layer 12, InP or ZnInP clad layer 13, InGaAsP contact layer 14, and $SiO_2$ etching mask 10 are sequentially formed.

In this case, the crystal layers are formed by epitaxial growth of specified crystal by crystal growth means such as LPE, VPE, MOCVD and MBE, while the $SiO_2$ etching mask 10 is formed through, for example, sputtering means.

Next, as shown in FIG. 2 (B), by patterning by the technique of photolithography, the undesired parts of the InGaAsP contact layer 14 and $SiO_2$ etching mask 10 are removed.

Afterwards, as shown in FIG. 2 (C), an n-type buried layer 15 such as InP or Fe-doped InP, nondoped InP is formed in the etching portions formed at both sides of the mesa-shaped InGaAsP contact layer 14 through the crystal growth means mentioned above.

In this case, since the upper surface of the InGaAsP contact layer 14 is covered with $SiO_2$ etching mask 10, the layer of InP is not formed on the upper surface, and therefore the InGaAsP contact layer 14 is buried into the n-type InP buried layer 15.

Thereafter, from the upper surface of the InGaAsP contact layer 14 from which the $SiO_2$ etching mask 10 is removed to the upper surface of the n-type InP buried layer 15, a silicon insulation film 16 such as $SiN_x$, $SiO_2$ and amorphous Si is formed by sputtering, and after opening a window in the middle part of the silicon insulation film 16, p-type electrode metal layers 19 of Ti, Pt, Au or the like are evaporated on the upper surfaces of the InGaAsP contact layer 14, n-type InP-buried layer 15 and silicon insulation film 16, and similarly an n-type electrode metal layer 20 of the same metal conductor is evaporated on the lower surface of the n-type InP substrate 11.

In this way, the semiconductor device as shown in FIG. 1 is obtained In such laminate structure of the semiconductor device, any large step difference of over 1 μm is not formed between the middle and periphery of the p-type electrode metal layer 19, and breakage of the p-type electrode metal layer 19 due to step difference does not occur, and still more only by inverting the conductive type of the InP-buried layer 15 from that of the InP clad layer 13, a current confinement effect by P-N junction can be achieved in this buried layer 15.

In the semiconductor device in FIG. 1, when a voltage is applied between the p-type electrode metal layer 19 and the n-type electrode metal layer 20, the injection current is constricted within the range of second current confinement window 18, and the specified portion of the InGaAaP active layer 12 corresponding to it emits light.

In such semiconductor device, should defects X occur in the semiconductor layer near the inner circumference of the first current confinement window 17 in the silicon insulation film 16, such defects X are located outside the substantial confinement current passing part by the second current confinement window 18, and hence nonlight emitting part is not formed within this light emitting region.

Figure 3:
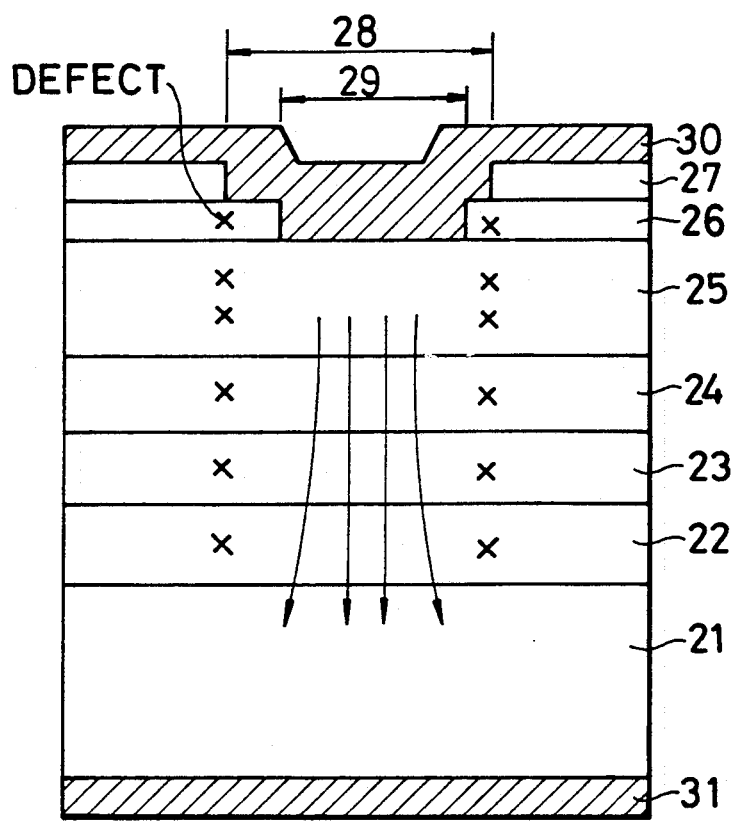
FIG. 3 is a sectional view showing a second embodiment of the semiconductor device of the invention.

Next is described the semiconductor device shown in Fig. 3.

In FIG. 3, numeral 21 denotes an n-type InP substrate, 22 is an n-type InP-clad layer, 23 is an InGaAsP active layer, 24 is a p-type InP-clad layer, 25 is a p-type InGaAsP contact layer, 26 is a high resistance InP-blocking layer, and 27 is an SiO$_2$ dielectric film, and these layers and films are formed in the specific sequence and at specific positions on the n-type InP substrate 21.

In this constitution, a first current confinement window 28 is formed on the SiO$_2$ dielectric film 27, and a second current confinement window 29 is formed on the InP blocking layer 26.

In the relative position of the first current confinement window 28 and the second current confinement window 29, the window area of the first current confinement window 28 is wider than the window area of the second current confinement window 29.

Furthermore, on the upper surface of the semiconductor layer grown on the n-type InP substrate 21, a p-type electrode metal 30 made of Ti, Pt, Au or their alloy is disposed, while on the lower surface of the n-type InP substrate, an n-type electrode metal layer 31 of the same metal conductor is disposed.

An example of fabricating the semiconductor device shown in FIG. 3 is explained below.

First, through the crystal growth means, n-type InP clad layer 22, InGaAsP active layer 23, p-type InP-clad layer 24, p-type InGaAsP contact layer 25, and InP-blocking layer 26 are sequentially formed on an n-type InP substrate 21 by epitaxial growth, and an SiO$_2$ insulation film 27 is formed on the InP blocking layer 26 by sputtering.

Next, through the etching means using a fluoric etchant, a first current confinement window 28 with window diameter of 30 μm is opened in the SiO$_2$ insulation film 27, and a second current confinement window 29 with window diameter of 30 μm in the InP-blocking layer 26, and the SiO$_2$ insulation film 27 is further etched to widen the window diameter of the first current confinement window 28 to 40 μm.

Afterwards, on the upper surface of the semiconductor layer grown on the n-type InP substrate 21, a p-type electrode metal layer 30 is evaporated, while an n-type electrode metal layer 31 is evaporated on the lower surface of the n-type InP substrate 21, thereby obtaining the semiconductor device in FIG. 3.

In the semiconductor device in FIG. 3, when a voltage is applied between the p-type electrode metal layer 30 and the n-type electrode metal layer 31, same as in the above embodiment, the infection current is contracted within the range of the second current confinement window 29, and a specified portion of the InGaAsP active layer 23 corresponding to it emits light.

In such semiconductor device, should defects X occur inside of the first current confinement window 28 in the SiO$_2$ insulation film 27, such defects X are located outside the substantial confinement current passing part by the second current confinement window 29 and are also remote from the light emitting portion by as far as about 5 μm, and hence non-light emitting portion will not be formed within the light emitting region.

Figure 8:
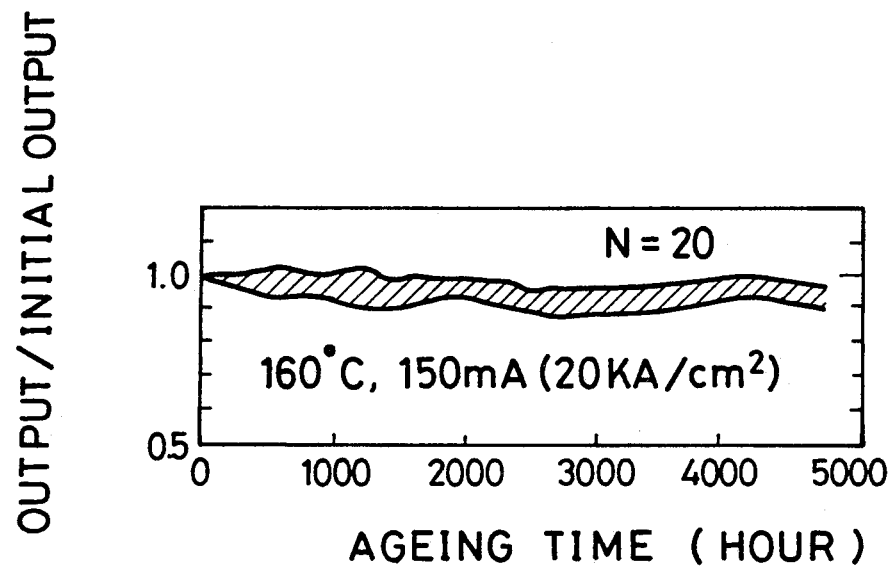
FIG. 8 is a explanatory drawing showing the result of current passing test of the semiconductor device (LED) of the invention.

Incidentally, in the semiconductor device in FIG. 3 according to this embodiment, when an electric current of 150 mA was passed for 5000 hours at 160° C. as shown in FIG. 8, the change in power was not more than 5%, and formation of dark line (non-light emitting portion) was not recognized.

Figure 7:
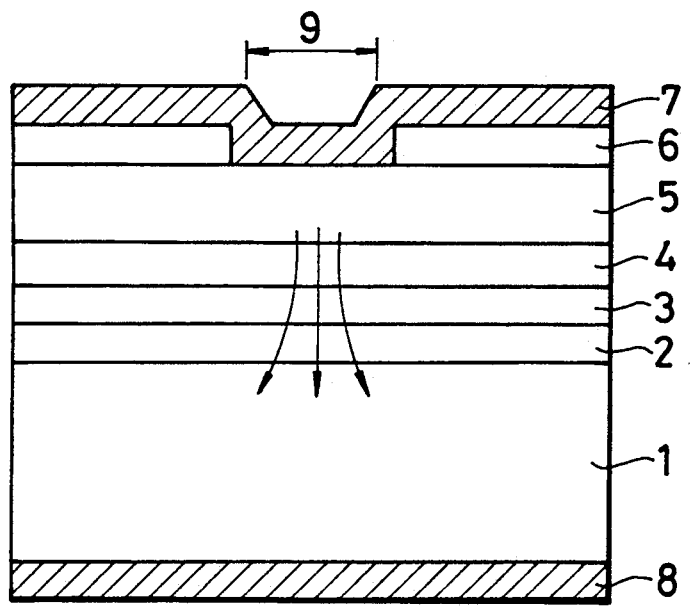
FIG. 7 is a sectional view showing a conventional semiconductor device.
Figure 9:
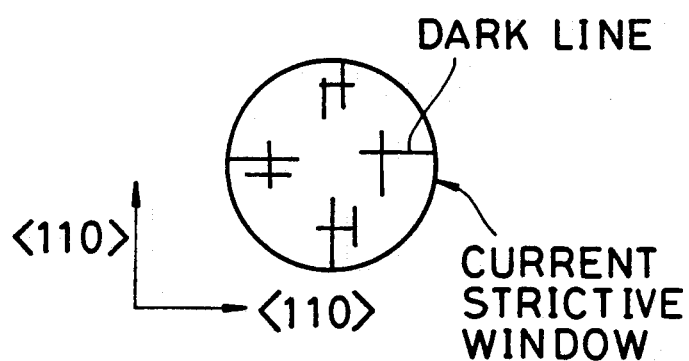
FIG. 9 is a explanatory drawing of dark line formed in a conventional semiconductor device (LED).

By contrast, in the conventional semiconductor device (FIG. 7), when an electric current of 100 mA was passed for 20 hours at 160° C., the power deterioration was over 10%, and multiple dark lines corresponding to the crystal position 100 were formed in the light emitting part as shown in FIG. 9.

Figure 4:
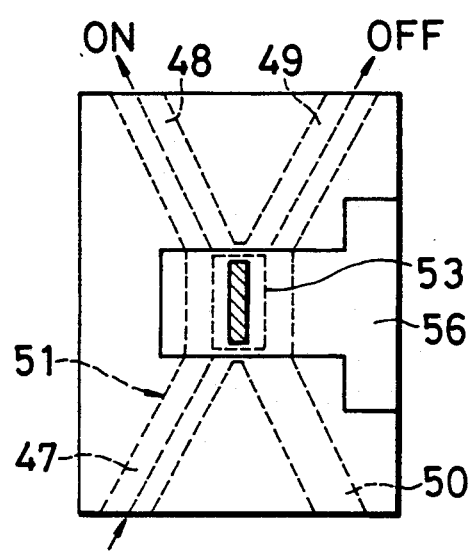
FIGS. 4 and 5 are a plan view and a sectional view showing a third embodiment of the semiconductor device of the invention.
Figure 5:
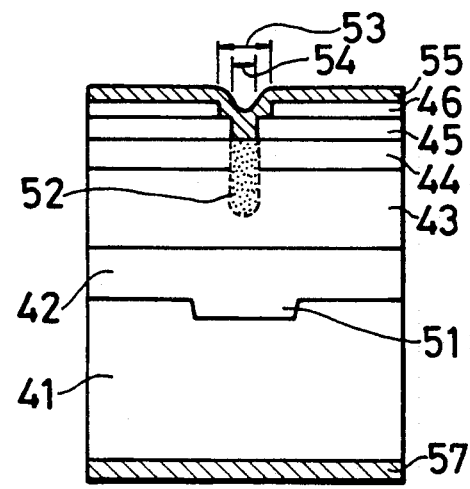

Another semiconductor device is shown in FIGS. 4, 5.

In FIGS. 4, 5, numeral 41 is an n-type InP substrate, 42 is an InGaAsP active layer, 43 is an InP clad layer, 44 is a p-type InGaAsP gap layer, 43 is an InP clad, 44 is a p-type InGaAsP cap layer, 45 is an InP-blocking layer, and 46 is an SiO$_2$ insulation film, and these layers and films are formed on the n-type InP substrate in a specific sequence and at specified positions.

The InGaAsP active layer contains a cross type optical waveguide 51 possessing four branching ends 47, 48, 49, 50, and a p-type Zn diffusion region 52 is provided in the p-type InGaAsP gap layer 44 and InP-blocking layer 45.

A first current confinement window 53 is formed in the SiO$_2$ insulation film 46, and a second current confinement window 54 in the InP-blocking layer 45.

In the relative relation of the first confinement window 53 and the second current confinement window 54, the window area of the first current confinement window 53 is wider than the window area of the second current confinement window 54.

Furthermore, on the upper surface of the semiconductor layer grown on the n-type InP substrate 41, a p-type electrode metal layer 55 and an electrode 56 for control current made of Ti, Pt, Au or their alloy are disposed, while an n-type electrode metal layer 57 of the same metal conductor is provided or the lower surface of the n-type InP substrate 41.

The semiconductor device shown in FIGS. 4, 5 is a current injection type photo switch.

In the case of such semiconductor device, an electric current of 10 kA/cm$^2$ is injected in stripes in the cross part of the optical waveguide 51 so as to provide this cross part with light reflectivity (cross part carrier high density=refractive index drop), or when current injection is reduced or stopped to recover the light transmissivity of the cross part possesses light reflectivity, the guide light entering the optical waveguide 51 from the branch end 47 is reflected in the cross part to be emitted from the branch end 48, and, to the contrary, when the cross part possesses light transmissivity, the guide light entering the optical waveguide 51 from the branch end 47 is allowed to move (penetrating through the cross part) to be emitted from the branch end 48.

The semiconductor device shown in FIGS. 4, 5 can be used as current injection type widely in the whole field of OEIC in combination with FET, LED, LD, etc.

Figure 6:
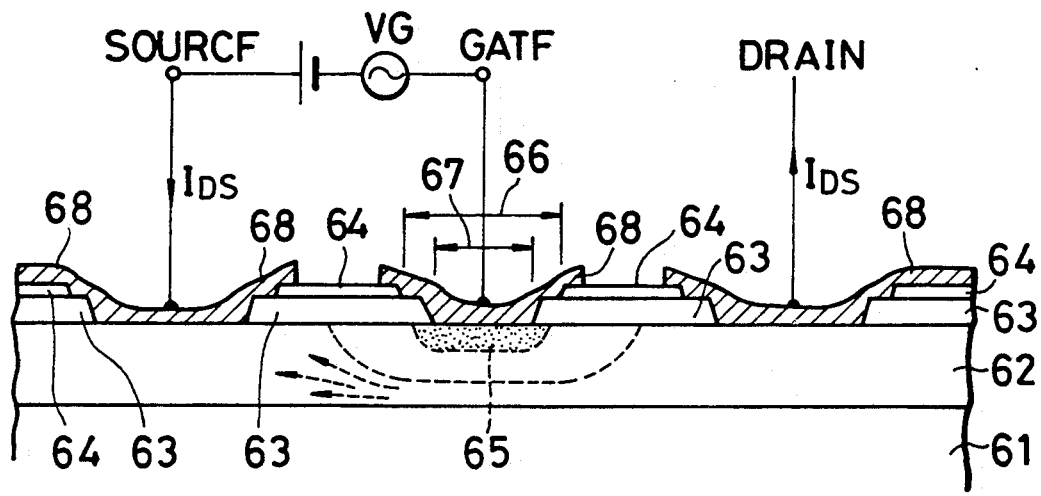
FIG. 6 is a sectional view of essential parts showing a fourth embodiment of the semiconductor device of the invention.

The semiconductor shown in FIGS. 6 is described below.

In FIGS. 6, numeral 61 denotes an InP semiinsulated substrate doped with Fe, 62 is an n-type InGaAsP channel layer formed on this InP semiinsulated substrate 61, 63 is a nondoped InP-blocking layer formed on the n-type InGaAsP channel layer 62, and 64 is an $SiO_2$ insulation film formed on the InP-B3 layer 63, and these layer and films are formed on the InP semiinsulated substrate 61 in a specific sequence and at specific positions.

In this constitution, a p-type Zn diffusion region 65 is provided in the n-type InGaAsP channel layer 62, and a first current confinement window 66 is formed in the $SiO_2$ insulation film 64 and a second current confinement window 67 in the InP-blocking layer 63.

In the relative relation of the first current confinement window 66 and second current confinement window 67, too, the window area of the first current confinement window 66 wider than the window area of the second current confinement window 67.

On the upper surface of the semiconductor layer laminated on the InP semiinsulated substrate 61, an electrode metal layer 68 made of Ti, Pt, Au or their alloy is disposed.

The semiconductor device shown in FIG. 6 is an FET, and when a bias voltage is applied to a specific portion of such semiconductor device with the terminals of source, gate and drain being connected, the carrier flows through the n-type InGaAsP channel layer 62 in a specified direction, and the current flows from the source side to the drain side, and in this embodiment in FIG. 6, the first current confinement window 66 and second current confinement window 67 are similarly disposed, so that the reliability of the source electrode and drain electrode when a large current flows in and out can be enhanced.

In the semiconductor device of the specific invention, as stated herein, the current blocking layer is made of semiconductor material, and the electric characteristic (resistance) of this current blocking layer is properly determined in the relative relation with the electrode metal layer, so that the reliability of quality and characteristics may be enhanced, while the product yield may be also improved. Furthermore, in the semiconductor device of the related invention, since a silicon dielectric film possessing a current confinement window wider in window area than the current confinement window of the current blocking layer is intervening between the current blocking layer and electrode metal layer in the above specific invention, deterioration of characteristics due to the defects introduced into the semiconductor layer may be avoided more securely.

It is to be understood that the above-mentioned embodiments are only illustrative of the application of the principles of the present invention. Numerous modifications and alterations may be made by those skilled in the art without departing from the spirit and scope of the invention, and the appended claims are intended to cover such modifications and alterations.

What is claimed is:

1. A semiconductor device comprising:
    an active layer formed on a semiconductor substrate;
    an electrode;
    a first semiconductor layer in contact with the electrode;
    a first current blocking layer formed on the first semiconductor layer and having a current confinement window;
    wherein the contact resistance between the current blocking layer and the electrode is higher than the contact resistance between the electrode and the first semiconductor layer; and
    a second current blocking layer formed on said first blocking layer and provided with a dielectric insulation material having a window portion with an area larger than that of the current confinement window.

2. A semiconductor device according to claim 1, wherein the first semiconductor layer is a contact layer.

3. A semiconductor device according to claim 1, wherein the first semiconductor layer is a cap layer.

4. A semiconductor device according to claim 1, wherein said window portion is contiguous to said first current blocking layer and an electrode is provided in the window portion.

5. A semiconductor device comprising:
    a semiconductor substrate;
    an active layer formed on the semiconductor substrate;
    an electrode
    a first current blocking layer formed on said first semiconductor layer and having a current confinement window;
    the resistance of the current blocking layer being higher than the contact resistance between the electrode and the first semiconductor layer; and
    a second current blocking layer formed on the first blocking layer and provided with a dielectric insulating material having a window portion with an area larger than that of said window.

6. A semiconductor device according to claim 5, wherein the first semiconductor layer is a contact layer.

7. A semiconductor device according to claim 5, wherein the first semiconductor layer is a cap layer.

8. A semiconductor device comprising:
    an active layer formed on a semiconductor substrate;
    a first semiconductor layer contacting with an electrode;
    a first current blocking layer formed on a cavity of said first semiconductor layer formed by removing a portion with only a current confinement window unremoved;
    wherein the contact resistance between the first current blocking layer and the electrode is higher than that between said electrode and the first semiconductor layer
    a second current blocking layer including the unremoved portion of said first current blocking layer and provided with a dielectric insulation material having a window portion with an area larger than said unremoved portion;

said first and second current blocking layers and said electrode being formed in the order listed.

9. A semiconductor device according to claim 8, wherein the first semiconductor layer is a contact layer.

10. A semiconductor device according to claim 8, wherein the first semiconductor layer is a cap layer.

11. A semiconductor device according to claim 8, wherein the first current blocking layer being formed by a semiconductor material with higher contact resistance than that between said first semiconductor layer and said electrode.

12. A semiconductor device according to claim 11, wherein the first semiconductor layer is a contact layer.

13. A semiconductor device according to claim 11, wherein the first semiconductor layer is a cap layer.

* * * * *